US012686099B2

(12) United States Patent
Chao

(10) Patent No.: US 12,686,099 B2
(45) Date of Patent: Jul. 21, 2026

(54) APPARATUS FOR POLISHING A WAFER

(71) Applicant: TAIWAN SEMICONDUCTOR MANUFACTURING COMPANY LIMITED, Hsin-Chu (TW)

(72) Inventor: Yu-Hsiang Chao, Taipei City (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 17/458,767

(22) Filed: Aug. 27, 2021

(65) Prior Publication Data

US 2023/0063687 A1      Mar. 2, 2023

(51) Int. Cl.
B24B 37/32      (2012.01)
B24B 37/20      (2012.01)
H10P 52/00      (2026.01)

(52) U.S. Cl.
CPC .............. B24B 37/32 (2013.01); B24B 37/20 (2013.01); H10P 52/00 (2026.01)

(58) Field of Classification Search
CPC .......................... B24B 37/27–34; B24B 37/12
See application file for complete search history.

(56) References Cited

U.S. PATENT DOCUMENTS

| | | | | | |
|---|---|---|---|---|---|
| 5,607,341 | A | * | 3/1997 | Leach | B24B 37/11 |
| | | | | | 451/287 |
| 5,658,183 | A | * | 8/1997 | Sandhu | B23Q 15/013 |
| | | | | | 451/6 |
| 5,836,807 | A | * | 11/1998 | Leach | B24B 37/11 |
| | | | | | 451/287 |
| 6,050,882 | A | * | 4/2000 | Chen | B24B 37/30 |
| | | | | | 451/41 |
| 6,220,944 | B1 | * | 4/2001 | Chen | B24B 37/30 |
| | | | | | 451/288 |
| 6,290,584 | B1 | * | 9/2001 | Kim | B24B 53/017 |
| | | | | | 451/288 |
| 6,436,228 | B1 | * | 8/2002 | Zuniga | B24B 37/28 |
| | | | | | 438/691 |
| 6,540,592 | B1 | * | 4/2003 | Schultz | B24B 37/32 |
| | | | | | 451/288 |
| 6,558,232 | B1 | * | 5/2003 | Kajiwara | B24B 49/16 |
| | | | | | 451/41 |
| 6,773,338 | B2 | * | 8/2004 | Yun | B24B 49/04 |
| | | | | | 451/41 |
| 7,326,105 | B2 | * | 2/2008 | Chandrasekaran | B24B 37/32 |
| | | | | | 451/285 |
| 2009/0311945 | A1 | * | 12/2009 | Strasser | B24B 37/32 |
| | | | | | 451/364 |
| 2021/0060726 | A1 | * | 3/2021 | Zuniga | B24B 37/10 |
| 2021/0308823 | A1 | * | 10/2021 | Watanabe | B24B 37/013 |

* cited by examiner

*Primary Examiner* — Monica S Carter
*Assistant Examiner* — Jonathan R Zaworski
(74) *Attorney, Agent, or Firm* — Cooper Legal Group, LLC

(57) ABSTRACT

An apparatus for polishing a wafer is provided. The apparatus includes a wafer carrier assembly including a head body and a retainer arrangement. The retainer arrangement includes a first retainer segment coupled to an underside of the head body and adjacent an outer sidewall of the wafer carrier and a second retainer segment, separate from the first retainer segment, coupled to the underside of the head body and adjacent the outer sidewall of the wafer carrier. Undersides of the first retainer segment and the second retainer segment are below an underside of the wafer carrier.

20 Claims, 9 Drawing Sheets

FIG. 8

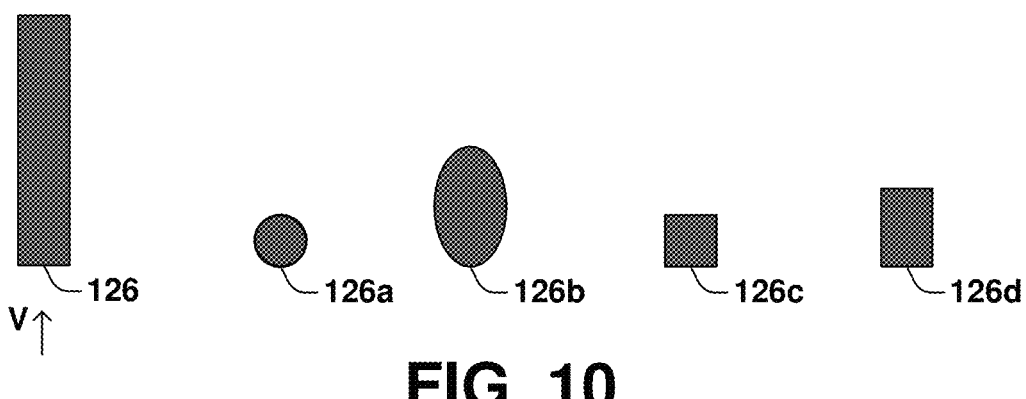
V↑
FIG. 10
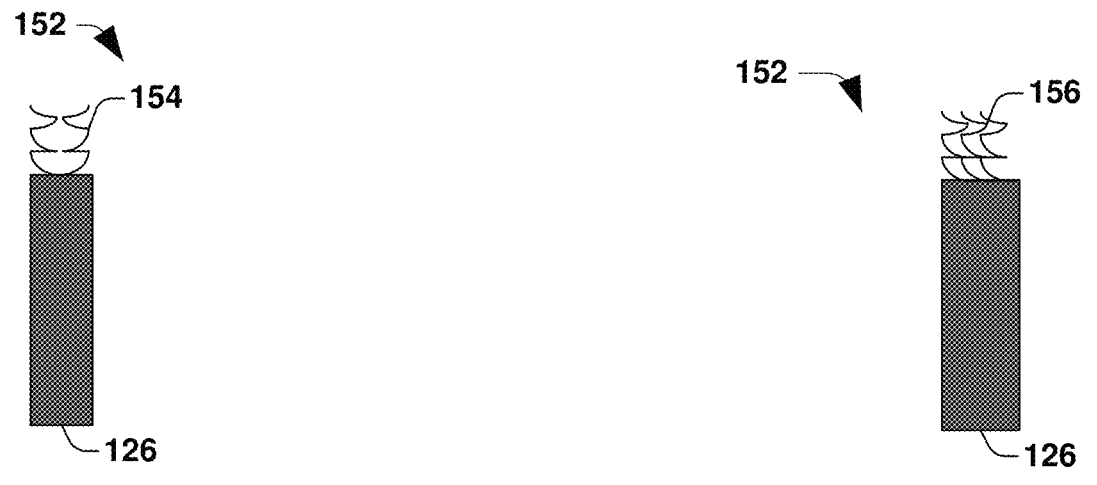
FIG. 11          FIG. 12
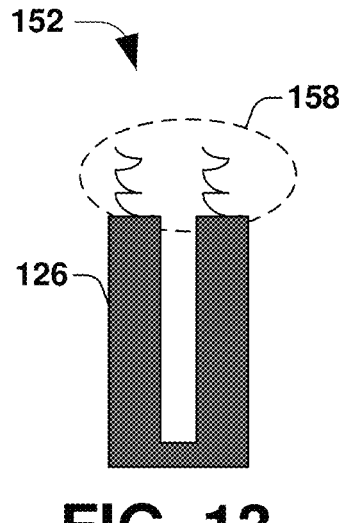
FIG. 13

APPARATUS FOR POLISHING A WAFER

BACKGROUND

Chemical mechanical polishing (CMP) is a widely used process by which both chemical and physical forces are used to globally planarize a semiconductor workpiece, such as a wafer. Generally, the planarization prepares the workpiece for the formation of a subsequent layer. A typical CMP tool comprises a rotating platen covered by a polishing pad. A slurry distribution system is configured to provide a polishing mixture, having chemical and abrasive components, to the polishing pad. A workpiece is then brought into contact with the polishing pad as the polishing pad is rotated by the platen to planarize the workpiece.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a top view of an apparatus for polishing a wafer, according to some embodiments.

FIG. 10 illustrates configurations of a retainer segment, according to some embodiments.

FIGS. 11-13 illustrate configurations of retainer arrangements, according to some embodiments.

DETAILED DESCRIPTION

Figure 1:
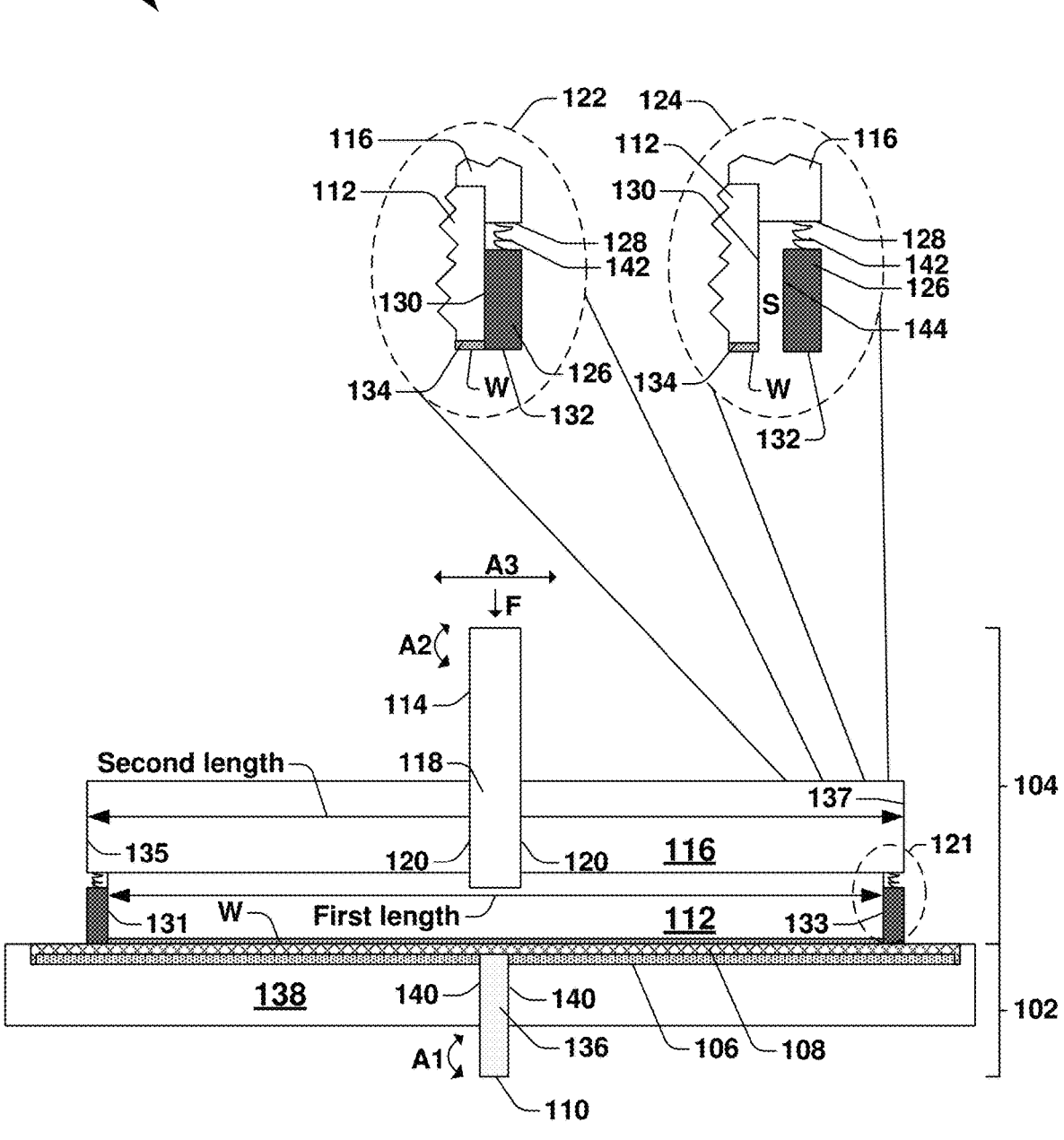
FIG. 1 is a cross-sectional illustration of an apparatus for polishing a wafer, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and/or the like, may be used herein to describe both direct and indirect relationships. "Directly" connected, adjacent, coupled, etc. may refer to a relationship in which there are no intervening components, devices, structures, etc. "Indirectly" connected, adjacent, coupled, etc. may refer to a relationship in which there are intervening components, devices, structures, etc.

One or more apparatuses for polishing a wafer are provided herein. According to some embodiments, an apparatus for polishing a wafer corresponds to a chemical mechanical polishing (CMP) system. An apparatus for polishing a wafer comprises a wafer carrier assembly. The wafer carrier assembly comprises a head body, a wafer carrier, and a retainer arrangement. The retainer arrangement comprises a set of retainer segments around the wafer carrier. The retainer segments extend below the wafer carrier such that the retainer segments inhibit a wafer, carried by the wafer carrier, from slipping out of the wafer carrier as the wafer carrier spins and/or forces the wafer against a surface of a polishing pad to polish the wafer. The retainer segments are coupled to the head body by biasing objects, such as springs, deformable bags, etc., that push the retainer segments onto the surface of the polishing pad. Thus, as the wafer polishing pad wears down, develops scrapes and/or divots, and/or otherwise deforms over time due to use, the retainer segments maintain contact with the wafer polishing pad, such as due to the downward force provided by the biasing objects, to inhibit the wafer from slipping out of and/or otherwise becoming dislodged from the wafer carrier.

A wafer polished in a chemical mechanical polishing system that does not have retainer segments as described above might slip out from the wafer carrier assembly. For example, a wafer carrier assembly comprising a rigid retainer that surrounds the wafer and is firmly coupled to the head body does not contact locations on the polishing pad where there are scrapes, divots, deformations, etc. in the polishing pad. In such a system, a wafer may escape from the wafer carrier assembly, such as by slipping through a gap between a bottommost surface of the retainer and a divot in the polishing pad. In contrast, the disclosed apparatus comprises retainer segments that are individually pressed onto the polishing pad surface by biasing objects. Thus, in areas of the polishing pad that include scrapes, divots, deformations, etc., the biased retainer segments are pressed onto the polishing pad surface and provide a barrier that inhibits the wafer from slipping out and/or otherwise becoming dislodged from the wafer carrier.

FIG. 1 is a cross-sectional illustration of an apparatus 100 for polishing a W, according to some embodiments. The apparatus 100 comprises a polishing wheel assembly 102 and a wafer carrier assembly 104. The polishing wheel assembly 102 comprises a polishing pad platen 106 and a wafer polishing pad 108 over a base 138. The polishing pad platen 106 is coupled to a rotational axle 110 of the polishing wheel assembly 102. The rotational axle 110 passes through an aperture 136 formed through the base 138. The aperture 136 is defined by interior side surfaces 140 of the base 138. The base 138 is below the wafer carrier assembly 104 to support the polishing pad platen 106 and the wafer polishing pad 108 for polishing the wafer.

The rotational axle 110 may be rotated or spun by any suitable motor or driving means (not shown) in one or both of the directions indicated by arrow A1. The polishing pad platen 106 is coupled to and rotates with the rotational axle 110. The wafer polishing pad 108 is attached (such as fitted) to the polishing pad platen 106, and thus rotates or spins with the polishing pad platen 106. In some embodiments, the polishing wheel assembly 102 is configured to move the polishing pad platen 106, and hence the wafer polishing pad 108, in a linear direction (not shown). In some embodiments, the polishing wheel assembly 102 is configured to rotate or spin the polishing pad platen 106 as well as transport the polishing pad platen 106 in a lateral direction, and hence rotate, spin, and/or transport the wafer polishing pad 108 in a lateral direction. Other configurations of the polishing wheel assembly 102, such as for rotating, spinning, and/or transporting the polishing pad platen 106 and the wafer polishing pad 108, are within the scope of the present disclosure.

The wafer carrier assembly 104 comprises a wafer carrier 112 configured to hold or grip the wafer, such as by vacuum. The wafer carrier 112 is coupled to a rotational axle 114 of the wafer carrier assembly 104. The rotational axle 114 passes through an aperture 118 formed through a head body 116 of the wafer carrier assembly 104. The aperture 118 is defined by interior surfaces 120 of the head body 116. The rotational axle 114 may be rotated or spun by any suitable motor or driving means (not shown) in one or both of the directions indicated by arrow A2. In some embodiments, the wafer carrier assembly 104 is configured to transport the rotational axle 114, and hence the wafer carrier 112, in one or more of the linear directions such as those indicated by arrow A3. The wafer carrier assembly 104 may be coupled to a wafer driver (not shown) to exert a force F on the rotational axle 114 in the direction indicated. The rotational axle 114 exerts the force F against the wafer carrier 112, and in turn the wafer carrier 112 exerts the force F against the wafer. Through application of the force F on the rotational axle 114, the wafer contacts the wafer polishing pad 108. Other configurations of the wafer carrier assembly 104, such as for rotating, spinning, and/or transporting the wafer carrier 112 and the wafer W, are within the scope of the present disclosure.

The wafer carrier 112 may be under or underlying the head body 116 of the wafer carrier assembly 104. The wafer carrier 112 has a first length in a first direction. The first length is a distance from a first edge 131 of the wafer carrier 112 to a second edge 133 of the wafer carrier 112. In some embodiments, the first length is a diameter of the wafer carrier 112. A shape of the wafer carrier 112 may be elliptical or disc shaped. The head body 116 has a second length in the first direction. The second length is a distance from a first edge 135 of the head body 116 to a second edge 137 of the head body 116. According to some embodiments, the second length is greater than the first length.

In some embodiments, rotation of the rotational axle 110 of the polishing wheel assembly 102 and rotation of the rotational axle 114 of the wafer carrier assembly 104 are each independently controlled by a controller (not shown). A rotational direction of the rotational axle 110 of the polishing wheel assembly 102 may be the same as or different than a rotational direction of the rotational axle 114 of the wafer carrier assembly 104. Other suitable techniques for controlling the rotational axle 110 of the polishing wheel assembly 102 and the rotational axle 114 of the wafer carrier assembly are within the scope of the present disclosure.

According to some embodiments, the wafer carrier assembly 104 is configured to lower the wafer carrier 112 to press the wafer against the wafer polishing pad 108 for polishing applications. The wafer carrier assembly 104 is also configured to draw the wafer away from the wafer polishing pad 108, such as by vacuum, for wafer load-in and wafer load-out operations.

The wafer carrier assembly 104 comprises a retainer arrangement 121. In some embodiments, the retainer arrangement 121 comprises a retainer arrangement 122, described with reference to FIGS. 1 and 2. In some embodiments, the retainer arrangement 121 comprises as a retainer arrangement 124, described with reference to FIGS. 1 and 3.

Retainer arrangement 122 comprises retainer segments, such as retainer segment 126, coupled to an underside 128 of the head body 116 and adjacent an outer sidewall 130 of the wafer carrier 112, wherein an underside 132 of the retainer segment 126 is below an underside 134 of the wafer carrier 112, such as at a lower vertical elevation than the underside 134 of the wafer carrier 112. In some embodiments, the underside 132 of the retainer segment 126 is a lowermost surface of the retainer segment 126 and the underside 134 of the wafer carrier 112 is a lowermost surface of the wafer carrier 112. In some embodiments, the retainer segment 126 is in contact with the outer sidewall 130. In a retainer arrangement such as retainer arrangement 122, the wafer W is adjacent the retainer segment 126 such that the wafer abuts or is in contact with the retainer segment 126. Retainer arrangement 122 inhibits the wafer from sliding out from under the wafer carrier 112 as the wafer carrier 112 rotates, spins, and/or laterally moves the wafer over the wafer polishing pad 108. The retainer arrangement 122 comprises a biasing object 142 coupled to the head body 116 and to the retainer segment 126 to bias the retainer segment 126 toward the base 138. In some embodiments, the biasing object 142 is a spring that exerts a mechanical force on or to the retainer segment 126 to push the retainer segment 126 downward and against the wafer polishing pad 108. The mechanical force may be in a range of 50 to 500 newtons, such that the retainer segment 126 is pressed against the wafer polishing pad 108 without causing excessive friction/wear between the underside 132 of the retainer segment 126 and the wafer polishing pad 108. Other configurations of the retainer arrangement 122 are within the scope of the present disclosure.

Retainer arrangement 124 comprises retainer segments, such as the retainer segment 126, coupled to the underside 128 of the head body 116 and adjacent the outer sidewall 130 of the wafer carrier 112, wherein the underside 132 of the retainer segment 126 is below the underside 134 of the wafer carrier 112, such as at a lower vertical elevation than the underside 134 of the wafer carrier 112. In some embodiments, the underside 132 of the retainer segment 126 is a lowermost surface of the retainer segment 126 and the underside 134 of the wafer carrier 112 is a lowermost surface of the wafer carrier 112. In some embodiments, a retainer segment sidewall 144 and the outer sidewall 130 are spaced apart by a space S, also referred to as open area S. In a retainer arrangement such as retainer arrangement 124, the wafer W is adjacent the retainer segment 126 such that space S is between the wafer and the retainer segment 126. Retainer arrangement 124 inhibits the wafer from sliding out from under the wafer carrier 112 as the wafer carrier 112 rotates, spins, and/or laterally moves the wafer over the wafer polishing pad 108. The retainer arrangement 124 comprises the biasing object 142 coupled to the head body 116 and to the retainer segment 126 to bias the retainer segment 126 toward the base 138. According to some embodiments, the biasing object 142 is a spring that exerts a mechanical force on or to the retainer segment 126 to push the retainer segment 126 downward and against the wafer polishing pad 108. The mechanical force may be in a range of 50 to 500 newtons, such that the retainer segment 126 is pressed against the wafer polishing pad 108 without causing excessive friction/wear between the underside 132 of the retainer segment 126 and the wafer polishing pad 108. Other configurations of the retainer arrangement 124 are within the scope of the present disclosure.

Figure 2:
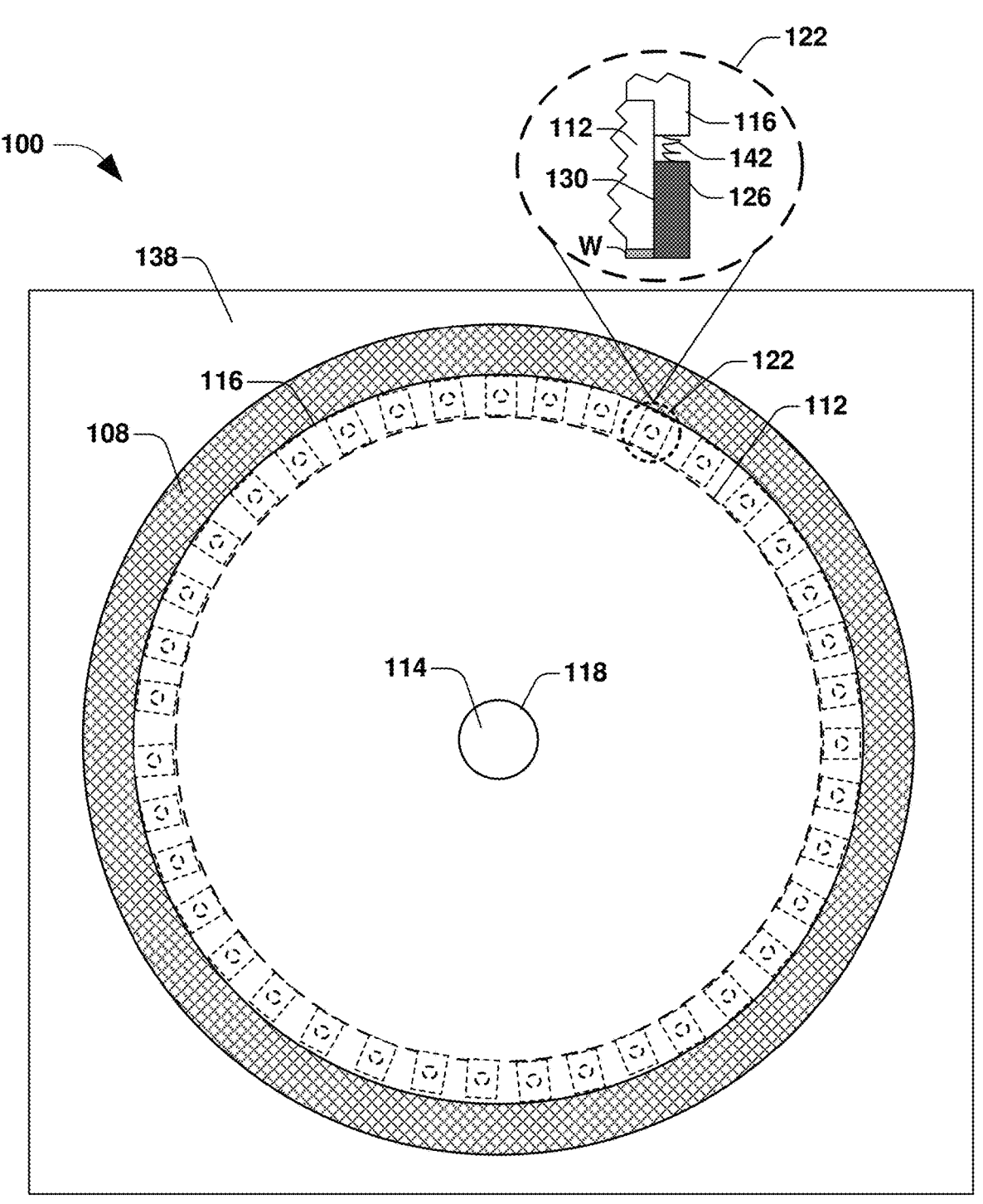
FIG. 2 is a top view of an apparatus for polishing a wafer, according to some embodiments.

FIG. 2 is a top view of an apparatus 100 for polishing a wafer W, according to some embodiments. The apparatus 100 comprises the wafer polishing pad 108 over the polishing pad platen 106 (not visible) and the base 138. The rotational axle 114 passes through the aperture 118 in the head body 116 and is coupled to the wafer carrier 112. Retainer arrangements 122 comprise the retainer segments 126 coupled to the head body 116 by biasing objects 142. The retainer segments 126 of the retainer arrangements 122 abut the outer sidewall 130 of the wafer carrier 112. Because the retainer segments 126 abut the outer sidewall 130 of the wafer carrier 112, movement of the wafer is restricted to within a boundary defined by the outer sidewall 130. In some embodiments, a first retainer segment and a second retainer segment are segments of a set of set of retainer segments formed as an ellipse or other shape around the wafer carrier 112. Other configurations for restricting movement of the wafer are within the scope of the present disclosure.

Figure 3:
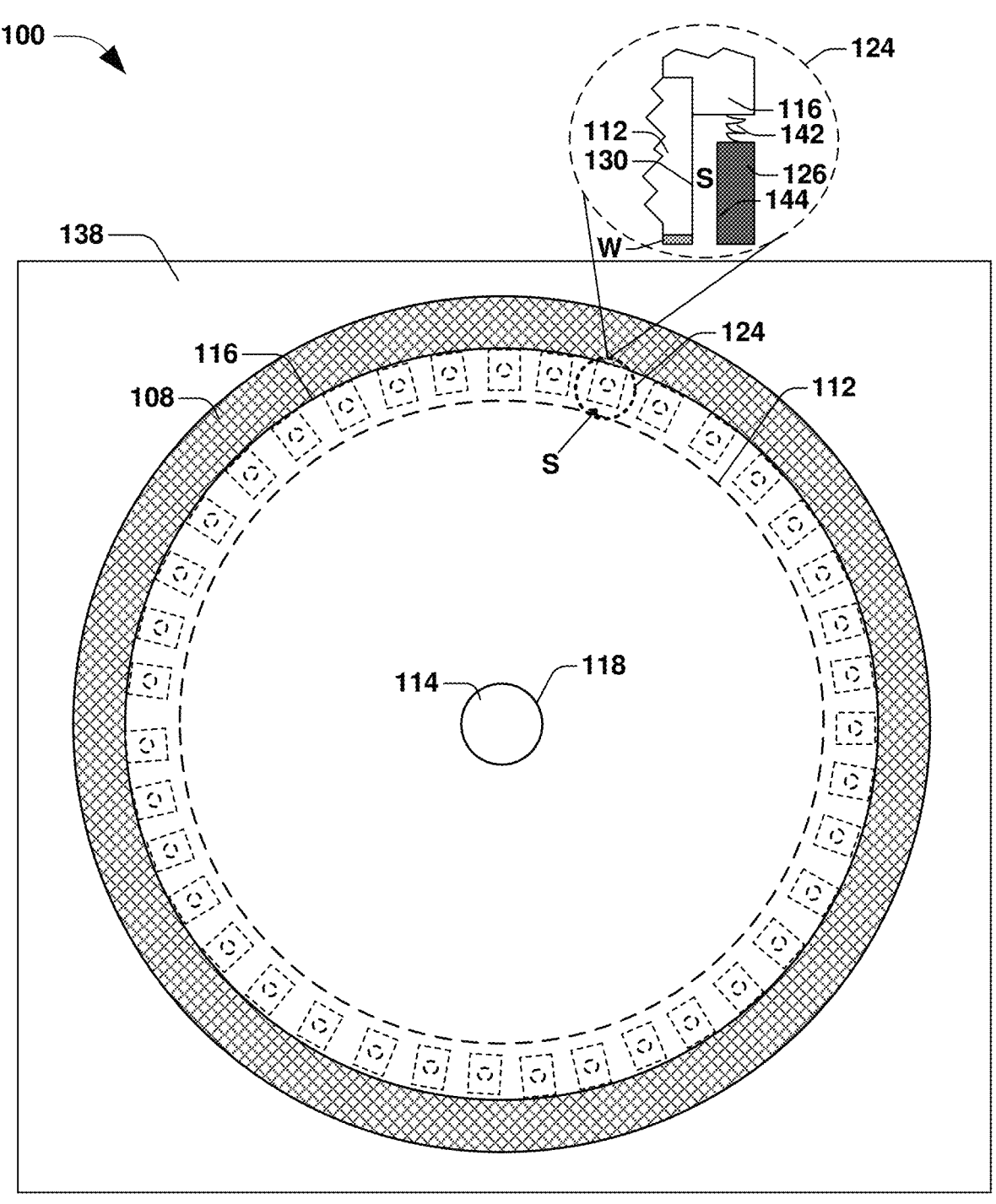
FIG. 3 is a top view of an apparatus for polishing a wafer, according to some embodiments.

FIG. 3 is a top view of an apparatus 100 for polishing a wafer W, according to some embodiments. The apparatus 100 comprises the wafer polishing pad 108 over the polishing pad platen 106 (not visible) and the base 138. The rotational axle 114 passes through the aperture 118 in the head body 116 and is coupled to the wafer carrier 112. Retainer arrangements 122 comprise the retainer segments 126 coupled to the head body 116 by biasing objects 142 and are adjacent the outer sidewall 130 of the wafer carrier 112. The retainer segment sidewall 144 and the outer sidewall 130 are separated by the space S. Because the retainer segment sidewalls 144 are separated from the outer sidewall 130 of the wafer carrier 112, movement of the wafer is restricted to within a boundary defined by the retainer segment sidewalls 144. In some embodiments, a first retainer segment and a second retainer segment are segments of a set of set of retainer segments formed as an ellipse or other shape around the wafer carrier 112. Other configurations for restricting movement of the wafer are within the scope of the present disclosure.

Figure 4:
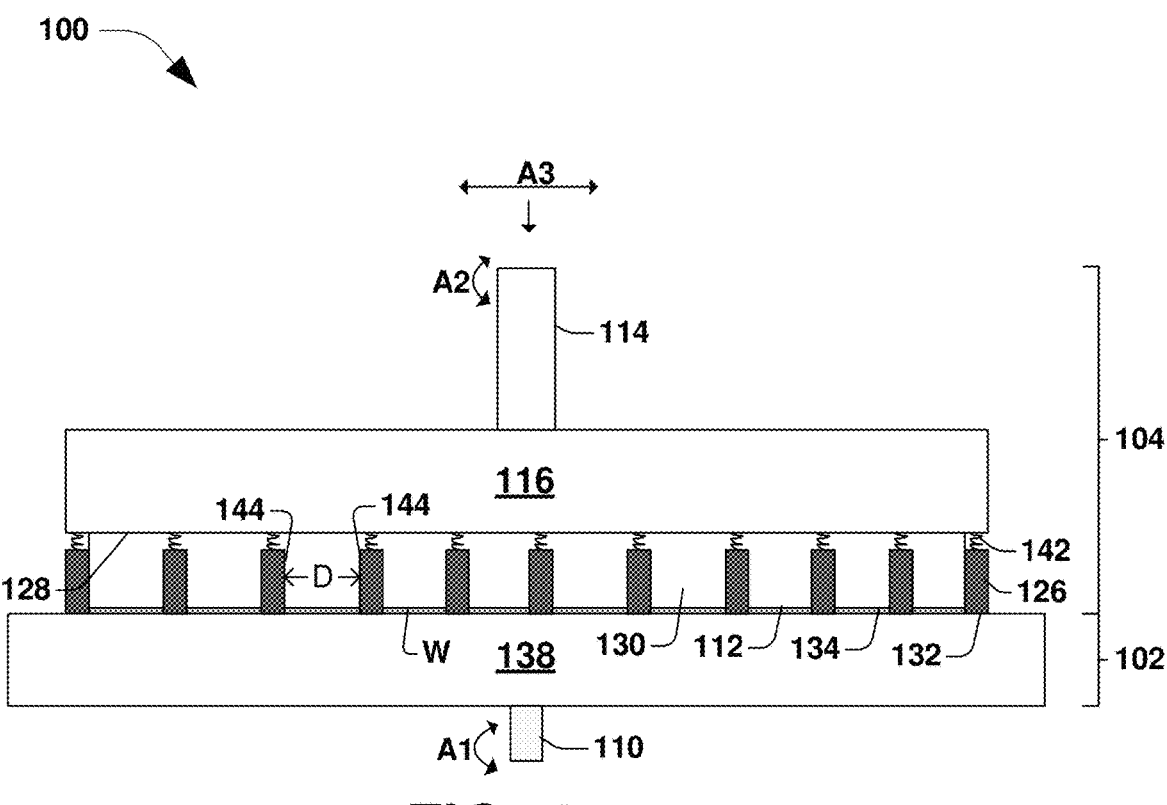
FIG. 4 is side view of an apparatus for polishing a wafer, according to some embodiments.

FIG. 4 is side view of an apparatus 100 for polishing a wafer W, according to some embodiments. The apparatus 100 comprises the polishing wheel assembly 102 and the wafer carrier assembly 104. The polishing wheel assembly 102 comprises the base 138 and the polishing pad platen 106 (not shown) and the wafer polishing pad 108 (not shown) over the base 138. The polishing pad platen 106 is coupled to the rotational axle 110. The rotational axle 110 may be rotated or spun by any suitable motor or driving means (not shown) in one or both of the directions indicated by arrow A1. The wafer carrier assembly 104 comprises the wafer carrier 112 configured to hold or grip the wafer W. The wafer carrier 112 is coupled to the rotational axle 114. The rotational axle 114 may be rotated or spun by any suitable motor or driving means (not shown) in one or both of the directions indicated by arrow A2. The retainer segments 126 are coupled to the underside 128 of the head body 116 and abut the outer sidewall 130 of the wafer carrier 112, wherein the underside 132 of the retainer segments 126 are below the underside 134 of the wafer carrier 112. Retainer segments 126 are separate from one another. For example, a first retainer segment is separate from a second retainer segment. In some embodiments, all of the retainer segment sidewalls 144 are separated from one another by a distance D. In some embodiments, some of the retainer segment sidewalls 144 are separated from one another by a distance D, and other of the retainer segment sidewalls are separated from one another by one or more distances that are greater than and/or less than distance D. In some embodiments, distance D is less than 20 millimeters (mm). A distance D that is less than 20 mm corresponds to inadequate spacing for the wafer to slide out from within the polishing wheel assembly 102 or between the retainer segments 126. The number of retainer segments 126 and the widths thereof and/or spacing therebetween are at least adequate to inhibit the wafer from sliding out of the polishing wheel assembly 102 or from between the retainer segments 126. For example, in some embodiments a number of retainer segments 126 is approximately one-hundred and the widths of the retainer segments 126 is such that the distance D is less than 20 mm. In some embodiments a number of retainer segments 126 is approximately 3 and the widths of the retainer segments 126 is such that the distance D between the retainer segments 126 is less than 20 mm. Other configurations and dimensions of the retainer segments 126 are within the scope of the present disclosure.

Figure 5:
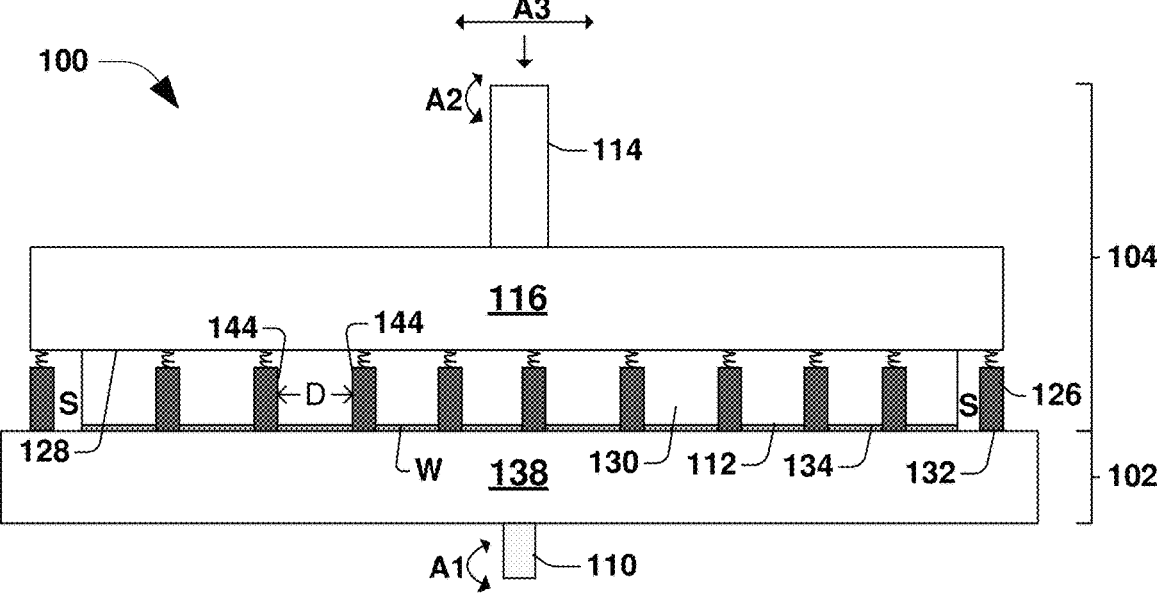
FIG. 5 is side view of an apparatus for polishing a wafer, according to some embodiments.

FIG. 5 is side view of an apparatus 100 for polishing a wafer W, according to some embodiments. The depiction of the apparatus 100 of FIG. 5 is similar to the depiction of the apparatus 100 of FIG. 4. However, in the apparatus of FIG. 5, the retainer segments 126 are adjacent the outer sidewall 130 of the wafer carrier 112 but separated therefrom by space S, as described above.

Figures 6, 7:
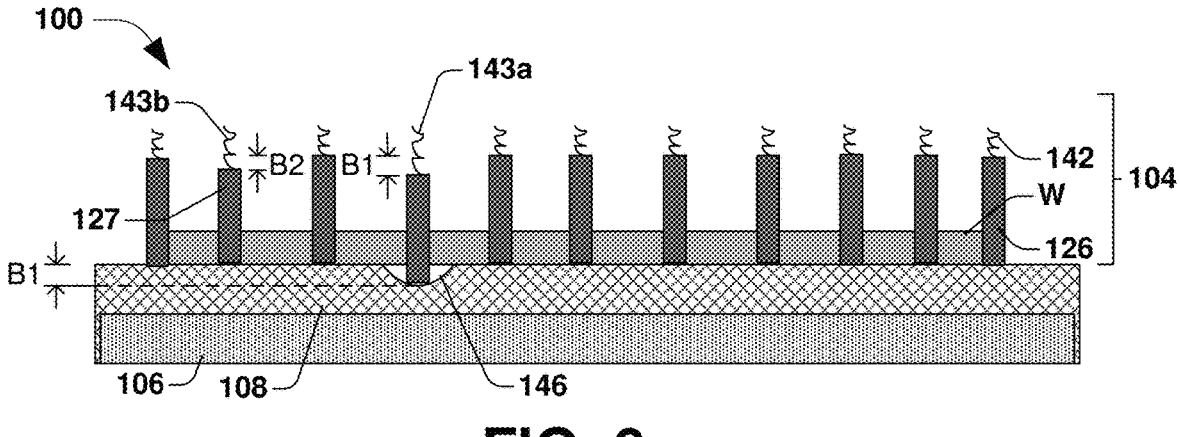
FIG. 6 is a side cross-sectional view of an apparatus for polishing a wafer, according to some embodiments.
FIG. 7 is a side view of an apparatus for polishing a wafer, according to some embodiments.

FIG. 6 is a side cross-sectional view of an apparatus 100 for polishing a wafer W, according to some embodiments. The apparatus 100 comprises the wafer polishing pad 108 over the polishing pad platen 106, the wafer over the wafer polishing pad 108, and the retainer segments 126. FIG. 6 illustrates different configurations of the retainer segments 126. Attached to other than underside, and bottom might be above when hits ridge on wafer The wafer polishing pad 108 and/or the retainer segments 126 may comprise, or come to comprise, damage or irregularities. The damage or irregularities may exist, for example, as a manufacturing defect or as a result of use of the wafer polishing pad 108 or the retainer segments 126. The retainer segments 126 may comprise, or come to comprise, effects of use, such as wear and tear resulting in diminished length.

As an example, the wafer polishing pad 108 may comprise, or come to comprise, irregularities 146 such as divots, scratches, punctures, etc. When an irregularity forms, a deflection of a biasing object 143a increases by a distance B1, the same distance as a depth B1 of the irregularity. Consequently, the retainer segment 126 maintains contact with the wafer polishing pad 108 to inhibit the wafer from sliding out of the wafer carrier assembly 104.

As an example, a retainer segment 127 may wear down such that a height of the retainer segment 127 diminishes by a distance B2. In accordance with embodiments of the present disclosure, as a height of the retainer segment 127 diminishes by the distance B2, a deflection of a biasing object 143*b* increases by the distance B2 such that the retainer segment 127 maintains contact with the polishing pad to inhibit the wafer from sliding out of the wafer carrier assembly 104.

In an example, an irregularity in the wafer polishing pad 108 may cause an elevation, bump, etc. on the wafer polishing pad 108. In such a situation, a biasing object, such as a spring, compresses, moves, etc. to allow a corresponding retainer segment coupled to the biasing object to elevate, deflect, etc. such that the retainer segment maintains contact with the polishing pad to inhibit the wafer from sliding out of the wafer carrier assembly 104. In such a situation, the underside of the retainer segment may, at least momentarily, not be below the underside of the wafer carrier.

FIG. 7 is a side view of an apparatus 100 for polishing a wafer W, according to some embodiments. The apparatus 100 comprises the polishing wheel assembly 102 and the wafer carrier assembly 104. The polishing wheel assembly 102 comprises the base 138 and the polishing pad platen 106 (not shown) and the wafer polishing pad 108 (not shown) over the base 138. The polishing pad platen 106 is coupled to the rotational axle 110 and may be rotated or spun as described above with reference to FIG. 4, or by other suitable means. The wafer carrier assembly 104 comprises the wafer carrier 112. The wafer carrier 112 is configured to hold or grip the wafer and is coupled to the rotational axle 114. The rotational axle 114 and the wafer carrier 112 may be rotated or spun as described above with reference to FIG. 4, or by other suitable means.

The retainer segments 126 are coupled to the underside 128 of the head body 116 and are adjacent the outer sidewall 130 of the wafer carrier 112. The underside 132 of the retainer segments 126 are below the underside 134 of the wafer carrier 112. In some embodiments, all of the retainer segment sidewalls 144 are separated from one another by distance D. In some embodiments, some of the retainer segment sidewalls 144 are separated from one another by a distance D, and other of the retainer segment sidewalls are separated from one another by one or more distances that are greater than and/or less than distance D. In some embodiments, distance D is less than 20 mm. A distance D that is less than 20 mm is inadequate spacing for the wafer to slide out from within the polishing wheel assembly 102 or between the retainer segments 126. The number of retainer segments 126 and the widths thereof and/or spacing therebetween are at least adequate to inhibit the wafer from sliding out of the polishing wheel assembly 102 or from between the retainer segments 126.

The wafer carrier assembly 104 comprises the biasing object 142 coupled to the head body 116 and to the retainer segment 126 to bias the retainer segment 126 toward the base 138. According to some embodiments, the biasing object 142 is a deformable bag, such as an elastic deformable bag, containing at least one of liquid or air at an internal pressure in the range of 50-600 hectopascals such that the retainer segment 126 is pressed against the wafer polishing pad 108 without causing excessive friction between the underside 132 of the retainer segment 126 and the wafer polishing pad. Other configurations of the biasing object 142 are within the scope of the present disclosure.

The retainer arrangement 122/124 surrounds the wafer and inhibits the wafer from popping out of the wafer carrier assembly 104. The retainer arrangement 122/124 also presses against a polishing surface 148 of the wafer polishing pad 108 and may flatten and fine down the polishing surface 148. Hence, the retainer arrangement 122/124 enhances the polishing surface's flatness and lowers the polishing surfaces roughness. In consideration of chemical resistance, mechanical properties, and/or the like, the retainer segments 126 may comprise a plastic, a polymer, polyphenylene sulfide, and/or other suitable material.

FIG. 8 is a top view of an apparatus 100 for polishing a wafer, according to some embodiments. The wafer carrier 112 is configured to hold or grip the wafer and is coupled to the rotational axle 114. The rotational axle 114 and the wafer carrier 112 may be rotated or spun as described above with reference to FIG. 4, or by other suitable means. The retainer segments 126 are coupled to the underside of the head body 116 and are adjacent the outer sidewall 130 of the wafer carrier 112. The apparatus 100 comprises the biasing object 142 coupled to the head body 116 and to the retainer segment 126 to bias the retainer segment 126 toward the base 138.

Figure 9:
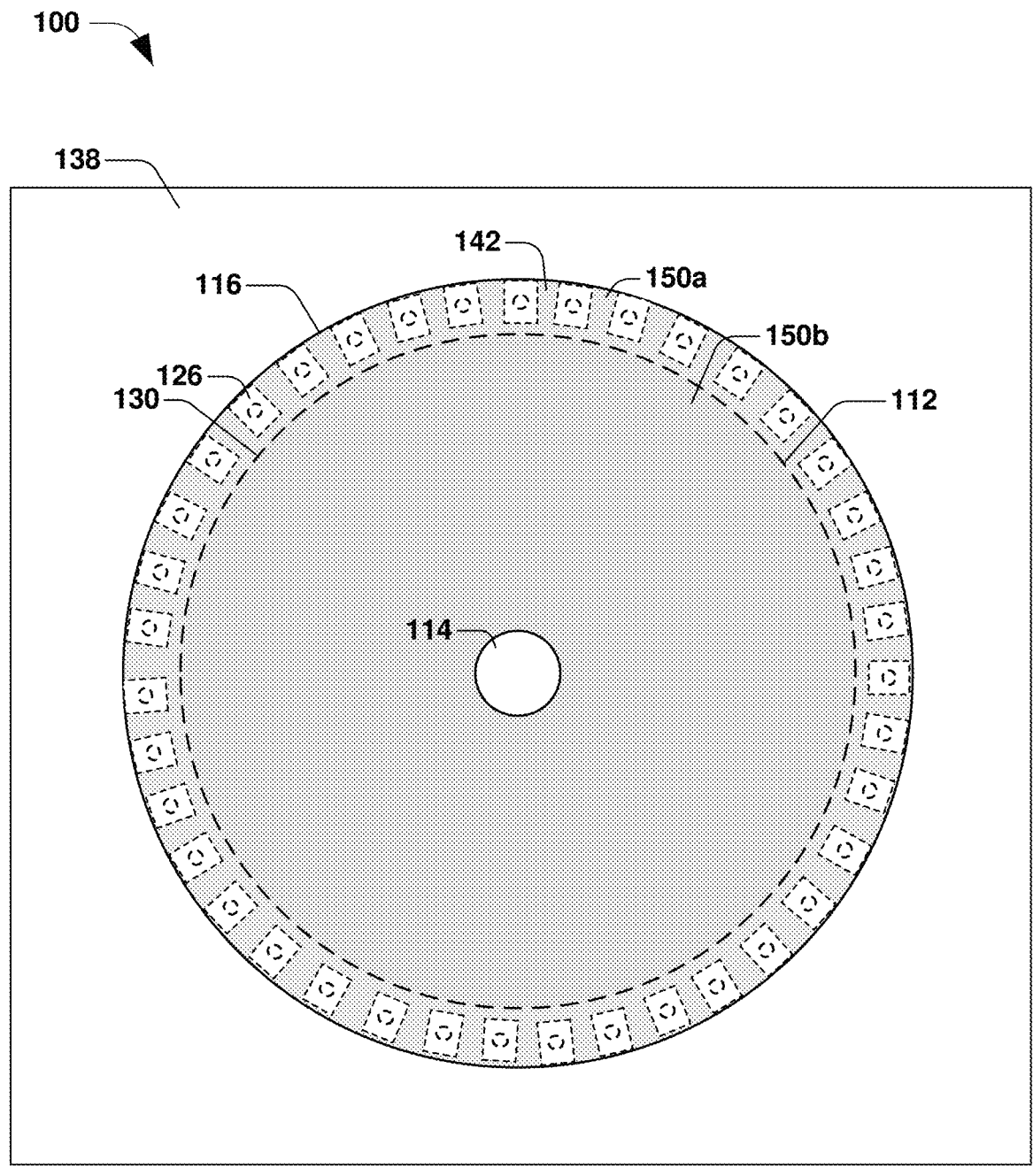
FIG. 9 is a top view of an apparatus for polishing a wafer, according to some embodiments.

FIG. 9 is a top view of an apparatus 100 for polishing a wafer, according to some embodiments. The apparatus 100 includes the wafer carrier 112, the rotational axle 114, the head body 116, the retainer segment 126, the outer sidewall 130, and the biasing object 142. The biasing object 142 comprises an outer portion 150*a* over the retainer segments 126 and an inner portion 150*b* over the wafer carrier 112. In some embodiments, the inner portion 150*b* of the biasing object 142 comprises springs, an elastic deformable bag, or other suitable object. The inner portion 150*b* may increase a uniformity of force distributed onto the wafer carrier 112. Other configurations of the biasing object 142 are within the scope of the present disclosure.

FIG. 10 illustrates configurations of a retainer segment 126, according to some embodiments. The retainer segment 126 viewed from perspective V (bottom view) may comprise, such as in cross-section, a segment of a shape of a circle 126*a*, a segment of a shape of an ellipse 126*b*, a segment of a shape of a square 126*c*, a segment of a shape of a rectangle 126*d*, and/or other suitable shapes.

FIG. 11 illustrates a configuration of a retainer arrangement 152, according to some embodiments. The retainer arrangement 152 may comprise the retainer segment 126 and a mirrored biasing element 154, according to some embodiments. The mirrored biasing element 154 may comprise springs in a mirrored configuration.

FIG. 12 illustrates a configuration of the retainer arrangement 152, according to some embodiments. The retainer arrangement 152 may comprise the retainer segment 126 and sequential biasing elements 156, according to some embodiments. The sequential biasing elements 156 may comprise springs in a sequential configuration.

FIG. 13 illustrates a configuration of the retainer arrangement 152, according to some embodiments. The retainer arrangement 152 may comprise the retainer segment 126 and multiple biasing elements 158, according to some embodiments. The multiple biasing elements 158 may comprise two or more springs. The retainer segment 126 may comprise multiple parts that are integral with one another. One or more of the parts of such a retainer segment may correspondingly have a biasing element or a portion of a biasing element.

Figure 14:
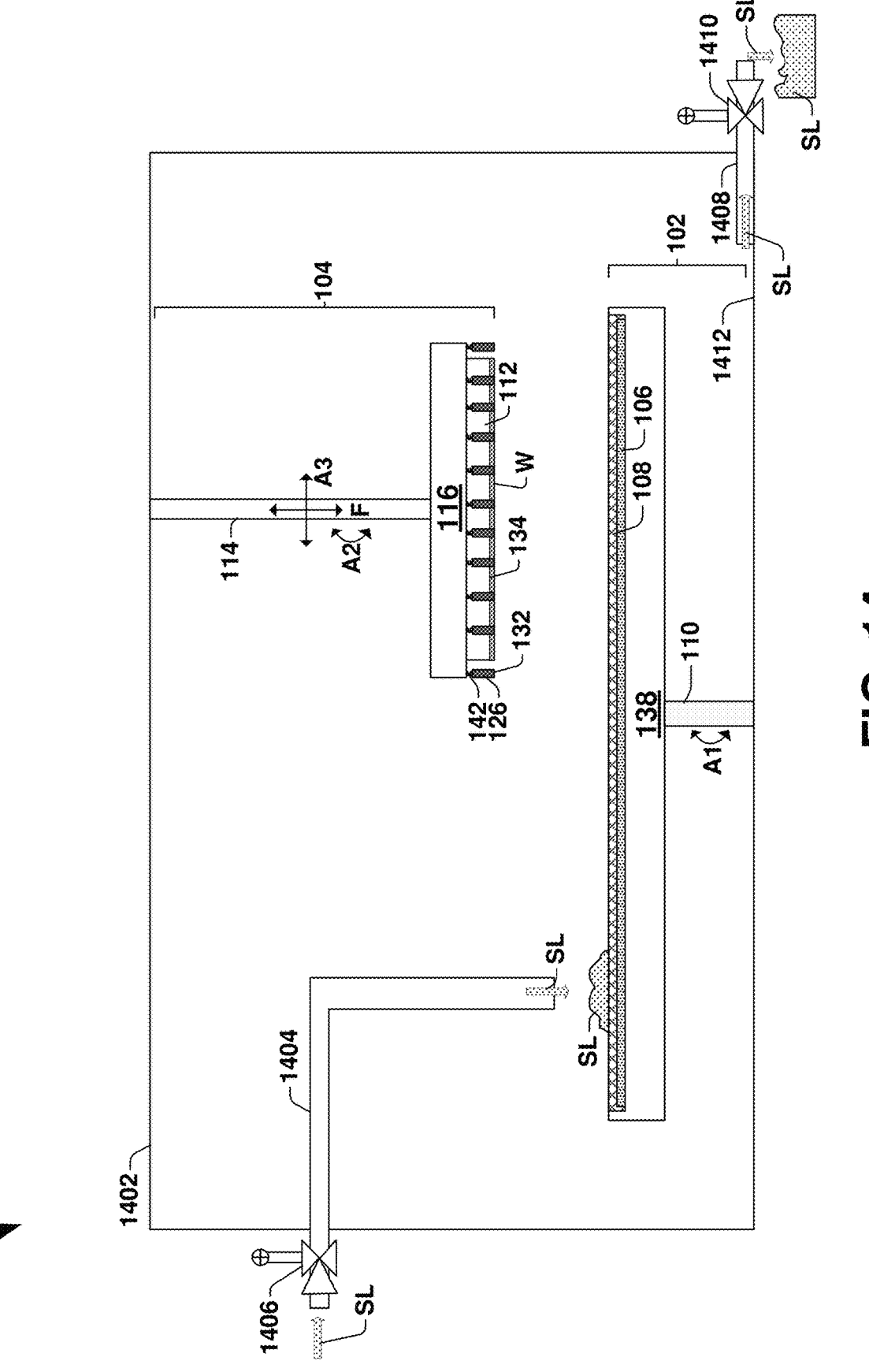
FIG. 14 illustrates a chamber for wafer processing, according to some embodiments.

FIG. 14 illustrates a chamber 1400 for wafer processing, according to some embodiments. The chamber 1400 comprises a housing 1402 a slurry (SL) input conduit 1404 coupled to a slurry input valve 1406 outside the housing 1402, and a slurry output conduit 1408 coupled to a slurry output valve 1410 outside the housing 1402, the polishing wheel assembly 102, and the wafer carrier assembly 104.

The polishing wheel assembly 102 comprises the base 138, the polishing pad platen 106, the wafer polishing pad 108, and the rotational axle 110. The wafer carrier assembly 104 comprises the head body 116, the wafer carrier 112, the retainer segments 126, the biasing object 142, the rotational axle 114, and the wafer W.

According to some embodiments, a processor (not shown) sends signals to or receives signals from components of the chamber 1400, the slurry input valve 1406, or the slurry output valve 1410. The processor may direct operations of the polishing wheel assembly 102 and the wafer carrier assembly 104. The processor may monitor or analyze conditions of the chamber 1400 and/or properties or conditions of the slurry SL based on information received from a sensor (not shown) or other suitable device.

The wafer is coupled to the wafer carrier 112 and encircled by the retainer segments 126. The wafer carrier 112 retains the wafer W. The rotational axle 114 provides a downward force F of at least two pound-force per square inch (psi) to inhibit the wafer from slipping during processing. The head body 116 is rotatable and may be coupled to a line, hose, or tube (not shown) that provides a vacuum force to pick-up and retain the wafer W. Wafer W processing may include preparing the wafer for polishing by depositing a patterned layer of material, such as a precursor or other suitable material, on the wafer surface. Wafer W processing may include planarizing, smoothing, or reducing thickness, or other suitable processing. The wafer may be picked up by the wafer carrier 112 by vacuum force. According to some embodiments, the wafer carrier assembly 104 positions the wafer at a suitable location over the wafer polishing pad 108 and moves the wafer up and down to establish or break contact with the wafer polishing pad 108.

Prior to or during wafer processing, a flow of slurry is directed through the slurry input valve 1406 and the slurry input conduit 1404 and onto the wafer polishing pad 108. Subsequent to wafer processing the slurry may exit the housing 1402 by way of the slurry output conduit 1408 and through the slurry output valve 1410, or by other suitable mechanism. The slurry output conduit 1408 may be located near a bottom surface 1412 of the housing 1402, or other suitable location.

In some embodiments, the polishing pad platen 106 is a high-rate platen to polish the wafer at a relatively high polishing rate using a polishing pad comprising a first coarseness suitable for performing high-rate polishing. In some embodiments, the polishing pad platen 106 is a low-rate platen to polish the wafer at a relatively low polishing rate using polishing pad comprising a second coarseness suitable for performing the low-rate polishing. In some embodiments, the polishing pad platen 106 is a buffing platen to buff and/or polish the wafer using a polishing pad comprising a third coarseness suitable for buffering. The platen 106 may also be suitable to diminish or remove defects or scratches or to achieve a target thickness of the wafer W.

For wafer processing inside the chamber 1400, the wafer polishing pad 108 is secured to the polishing pad platen 106 and the wafer is secured to the wafer carrier 112. The retainer segments 126 confine slippage of the wafer to a perimeter under the wafer carrier 112 defined by an arrangement of the retainer segments 126. The biasing objects 142 bias the retainer segments 126 toward the base 138 such that the underside 132 of the retainer segments 126 remain in contact with the wafer polishing pad 108. Thus, as the wafer polishing pad 108 wears down and/or develops scrapes and/or divots or other deformations, the retainer segments

126 maintain contact with the wafer polishing pad 108. The retainer segments 126 are individually pressed onto the polishing pad surface by springs and/or other biasing objects, such as deformable bags. The retainer segments 126 provide a barrier that inhibits the wafer W from slipping out. A chemical mechanical polishing system that comprises a single-piece retainer that surrounds the wafer does not form such a seal with the polishing pad, such as where there are scrapes, divots, and/or other deformations in the polishing pad. In such systems, a wafer may slip out from underneath the retainer and may have to be discarded, which is expensive and reduces yield.

According to some embodiments, one or more retainer segments are attached to other than the underside 128 of the head body 116. One or more retainer segments may be attached to an outer sidewall of the head body 116 and/or any other location on any other aspect of the apparatus 100. One or more features, such as arms, projections, cantilevers, etc., may protrude from the head body, for example, and one or more retainer segments may be attached to such features.

One or retainer segments may differ from one another. One or more retainer segments may be of a different size, shape, dimension, location, etc. relative to one or more other retainer segments, such as where one retainer segment has a square cross-section and another retainer segment has a circular cross-section, such as for wear, test, replacement, maintenance, etc. purposes. One or more retainer segments may be spaced from one another differently than one or more other retainer segments, such as where two retainer segments are separated by a first distance and another two retainer segments are separated by a second different distance, such as for wear, test, replacement, maintenance, etc. purposes. One or more retainer segments may be attached to a first location within the apparatus 100, such as the underside 128 of the head body 116, while one or more other retainer segments are attached to a second different location within the apparatus 100, such as an outer sidewall of the head body 116, such as for wear, test, replacement, maintenance, etc. purposes. One or more retainer segments may be attached within the apparatus 100 in a first manner, such as through a spring, while one or more other retainer segments are attached within the apparatus 100 in a second different manner, such as through a deformable bag, a combination of a spring and a deformable bag, and/or in any other manner, such as for wear, test, replacement, maintenance, etc. purposes.

An apparatus for polishing a wafer includes a wafer carrier assembly including a head body, a wafer carrier under the head body for holding the wafer during polishing, and a retainer arrangement. The retainer arrangement includes a first retainer segment coupled to an underside of the head body and adjacent an outer sidewall of the wafer carrier, wherein an underside of the first retainer segment is below an underside of the wafer carrier, and a second retainer segment, separate from the first retainer segment, and coupled to the underside of the head body and adjacent the outer sidewall of the wafer carrier, wherein an underside of the second retainer segment is below the underside of the wafer carrier.

An apparatus for polishing a wafer includes a wafer carrier, a head body, a first retainer segment, and a second retainer segment. The wafer carrier holds the wafer during polishing. The wafer carrier has a first length in a first direction. The first length is a distance from a first edge of the wafer carrier to a second edge of the wafer carrier. The head body is over the wafer carrier. The head body has a second length in the first direction. The second length is a distance from a first edge of the head body to a second edge of the head body, and the second length is greater than the first length. The first retainer segment is coupled to an underside of the head body. The second retainer segment is coupled to the underside of the head body. The underside of the first retainer segment is below an underside of the wafer carrier, and a distance separates a retainer segment sidewall of the second retainer segment from a retainer segment sidewall of the first retainer segment.

An apparatus for polishing a wafer includes a head body including an underside, a wafer carrier under the head body for holding the wafer during polishing, a base under the wafer carrier, wherein the base includes interior side surfaces defining an aperture through the base, a polishing pad platen to support a wafer polishing pad for polishing the wafer, a rotational axle thorough the aperture and coupled to the polishing pad platen, and a retainer arrangement including a first retainer segment coupled to the underside of the head body and adjacent an outer sidewall of the wafer carrier, wherein an underside of the first retainer segment is below an underside of the wafer carrier, and a second retainer segment, separate from the first retainer segment, and coupled to the underside of the head body and adjacent the outer sidewall of the wafer carrier, wherein an underside of the second retainer segment is below the underside of the wafer carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. An apparatus for polishing a wafer, comprising:

a head body;

a wafer carrier under the head body for holding the wafer during polishing, wherein the wafer carrier has a uniform thickness measured across the wafer carrier from a first location along an outer sidewall of the wafer carrier to a second location along the outer sidewall of the wafer carrier diametrically opposite the first location;

a base under the wafer carrier, wherein the base comprises interior side surfaces defining an aperture through the base;

a polishing pad platen to support a wafer polishing pad for polishing the wafer;

a first rotational axle through the aperture and coupled to the polishing pad platen; and a retainer arrangement comprising:

a first retainer segment coupled to a bottommost surface of the head body such that a topmost surface of the first retainer segment is below the bottommost surface of the head body and in direct contact with the outer sidewall of the wafer carrier, wherein an underside of the first retainer segment is below an underside of the wafer carrier;

a second retainer segment separate from the first retainer segment and coupled to the bottommost surface of the head body and adjacent the outer sidewall of the wafer carrier, wherein an underside of the second retainer segment is below the underside of the wafer carrier; and a first spring in direct contact with the bottommost surface of the head body and in direct contact with the first retainer segment, wherein:

the first retainer segment and the second retainer segment are segments of a set of retainer segments formed as an ellipse around the wafer carrier, a void separates the second retainer segment from the first retainer segment, and at least one of the first retainer segment or the second retainer segment has a non-circular elliptical cross-section in a cross-sectional view perpendicular to an underside of the head body.

2. The apparatus of claim 1, comprising a second rotational axle extending through the head body and contacting the wafer carrier.

3. The apparatus of claim 1, wherein merely the first spring is between the topmost surface of the first retainer segment and the bottommost surface of the head body.

4. The apparatus of claim 1, wherein:

the first retainer segment is separated from the second retainer segment by a first distance along an inside edge of the first retainer segment and an inside edge of the second retainer segment, the first retainer segment is separated from the second retainer segment by a second distance along an outer edge of the first retainer segment and an outer edge of the second retainer segment, and the second distance is greater than the first distance.

5. The apparatus of claim 1, wherein a number of retainer segments comprised in the retainer arrangement, including the first retainer segment and the second retainer segment, is at least 100.

6. The apparatus of claim 1, wherein the first spring exerts a force on the first retainer segment in a range of 50-500 Newtons.

7. The apparatus of claim 1, wherein the void is less than 20 millimeters in length.

8. An apparatus for polishing a wafer, comprising:

a head body;

a wafer carrier under the head body for holding the wafer during polishing, wherein the wafer carrier has a uniform thickness measured across the wafer carrier from a first location along an outer sidewall of the wafer carrier to a second location along the outer sidewall of the wafer carrier diametrically opposite the first location;

a base under the wafer carrier, wherein the base comprises interior side surfaces defining an aperture through the base;

a polishing pad platen to support a wafer polishing pad for polishing the wafer;

a first rotational axle through the aperture and coupled to the polishing pad platen; and a retainer arrangement comprising:

a first retainer segment coupled to a bottommost surface of the head body such that a topmost surface of the first retainer segment is below the bottommost surface of the head body and in direct contact with the outer sidewall of the wafer carrier, wherein an underside of the first retainer segment is below an underside of the wafer carrier;

a second retainer segment separate from the first retainer segment and coupled to the bottommost surface of the head body and adjacent the outer sidewall of the wafer carrier, wherein an underside of the second retainer segment is below the underside of the wafer carrier;

a third retainer segment, wherein:

the third retainer segment has a first end coupled to the bottommost surface of the head body by a first spring and a second end distal from the first end, the second retainer segment has a first end coupled to the bottommost surface of the head body by a second spring and a second end distal from the first end, and the second end of the third retainer segment is connected with the second end of the second retainer segment; and a third spring in direct contact with the bottommost surface of the head body and in direct contact with the first retainer segment, wherein:

the first retainer segment and the second retainer segment are segments of a set of retainer segments formed as an ellipse around the wafer carrier, and a void separates the second retainer segment from the first retainer segment.

9. The apparatus of claim 8, comprising a second rotational axle extending through the head body and contacting the wafer carrier.

10. The apparatus of claim 8, wherein a retainer segment sidewall of the first retainer segment is planar from the topmost surface of the first retainer segment to a bottommost surface of the first retainer segment.

11. The apparatus of claim 8, wherein merely the third spring is between the topmost surface of the first retainer segment and the bottommost surface of the head body.

12. The apparatus of claim 8, wherein:

the first retainer segment is separated from the second retainer segment by a first distance along an inside edge of the first retainer segment and an inside edge of the second retainer segment, the first retainer segment is separated from the second retainer segment by a second distance along an outer edge of the first retainer segment and an outer edge of the second retainer segment, and the second distance is greater than the first distance.

13. The apparatus of claim 8, wherein the second end of the third retainer segment is integrally connected with the second end of the second retainer segment.

14. The apparatus of claim 8, wherein the third spring exerts a force on the first retainer segment in a range of 50-500 Newtons.

15. The apparatus of claim 8, wherein the void is less than 20 millimeters in length.

16. An apparatus for polishing a wafer, comprising:

a head body;

a wafer carrier under the head body for holding the wafer during polishing, wherein the wafer carrier has a uniform thickness measured across the wafer carrier from a first location along an outer sidewall of the wafer carrier to a second location along the outer sidewall of the wafer carrier diametrically opposite the first location;

a base under the wafer carrier, wherein the base comprises interior side surfaces defining an aperture through the base;

a polishing pad platen to support a wafer polishing pad for polishing the wafer; and a retainer arrangement comprising:

a first retainer segment coupled to a bottommost surface of the head body such that a topmost surface of the first retainer segment is below the bottommost surface of the head body and in direct contact with the outer sidewall of the wafer carrier, wherein an underside of the first retainer segment is below an underside of the wafer carrier;

a second retainer segment separate from the first retainer segment and coupled to the bottommost surface of the head body and adjacent the outer sidewall of the wafer carrier, wherein an underside of the second retainer segment is below the underside of the wafer carrier; and a first spring in direct contact with the bottommost surface of the head body and in direct contact with the first retainer segment, wherein:

the first retainer segment and the second retainer segment are segments of a set of retainer segments formed as an ellipse around the wafer carrier, a void separates the second retainer segment from the first retainer segment, and at least one of the first retainer segment or the second retainer segment has a non-circular elliptical cross-section in a cross-sectional view perpendicular to an underside of the head body.

17. The apparatus of claim 16, comprising a first rotational axle extending through the head body and contacting the wafer carrier.

18. The apparatus of claim 16, wherein merely the first spring is between the topmost surface of the first retainer segment and the bottommost surface of the head body.

19. The apparatus of claim 16, wherein the first spring exerts a force on the first retainer segment in a range of 50-500 Newtons.

20. The apparatus of claim 16, wherein the void is less than 20 millimeters in length.

* * * * *